(12) United States Patent
Zhao et al.

(10) Patent No.: US 8,549,214 B2
(45) Date of Patent: Oct. 1, 2013

(54) PROTECTION AGAINST DATA CORRUPTION FOR MULTI-LEVEL MEMORY CELL (MLC) FLASH MEMORY

(75) Inventors: Qun Zhao, Pleasanton, CA (US); Xinhai Kang, Milpitas, CA (US)

(73) Assignee: Marvell World Trade Ltd., St. Michael (BB)

( * ) Notice: Subject to any disclaimer, the term of this patent is extended or adjusted under 35 U.S.C. 154(b) by 283 days.

(21) Appl. No.: 13/023,905

(22) Filed: Feb. 9, 2011

(65) Prior Publication Data
US 2011/0202710 A1    Aug. 18, 2011

Related U.S. Application Data

(60) Provisional application No. 61/305,493, filed on Feb. 17, 2010, provisional application No. 61/416,692, filed on Nov. 23, 2010.

(51) Int. Cl.
*G06F 12/00* (2006.01)

(52) U.S. Cl.
USPC .................................. 711/103; 711/E12.007

(58) Field of Classification Search
USPC .......................................................... 711/103
See application file for complete search history.

(56) References Cited

U.S. PATENT DOCUMENTS

| | | | |
|---|---|---|---|
| 5,715,423 A | 2/1998 | Levy | |
| 5,930,167 A | 7/1999 | Lee et al. | |
| 6,040,997 A | 3/2000 | Estakhri | |
| 7,583,545 B2 | 9/2009 | Lasser | |
| 2006/0193176 A1 | 8/2006 | Li | |
| 2007/0211530 A1 | 9/2007 | Nakano | |
| 2009/0307413 A1 | 12/2009 | Chu | |
| 2010/0082878 A1* | 4/2010 | Inoue et al. | 711/103 |

OTHER PUBLICATIONS

The International Search Report and Written Opinion for corresponding International Application No. PCT/US2011/025056, dated May 25, 2011, 13 pages.

* cited by examiner

*Primary Examiner* — Reginald Bragdon
*Assistant Examiner* — Hamdy S Ahmed

(57) ABSTRACT

Apparatus having corresponding methods and non-transitory computer-readable media comprise a flash controller configured to control a multi-level memory cell (MLC) flash memory, wherein the MLC flash memory includes a plurality of memory blocks, wherein each memory block includes a plurality of memory cells defining a plurality of pages, wherein each memory cell spans a group of the pages in one of the memory blocks, and wherein the flash controller comprises circuitry configured to receive data to be written to the MLC flash memory, select only one page, from each group of the pages, in one or to more of the memory blocks, and write the data only to the selected pages.

18 Claims, 4 Drawing Sheets

PROTECTION AGAINST DATA CORRUPTION FOR MULTI-LEVEL MEMORY CELL (MLC) FLASH MEMORY

CROSS-REFERENCE TO RELATED APPLICATIONS

This disclosure claims the benefit of U.S. Provisional Patent Application Ser. No. 61/305,493, entitled "Protection of Data Corruption for MLC NAND Flash," filed on Feb. 17, 2010, and U.S. Provisional Patent Application Ser. No. 61/416,692, entitled "Protection of Data Corruption for MLC NAND Flash," filed on Nov. 23, 2010, the disclosures thereof incorporated by reference herein in their entirety.

FIELD

The present disclosure relates generally to flash memory. More particularly, the present disclosure relates to operation of multi-level memory cell (MLC) flash memory.

BACKGROUND

Flash memory is a type of memory that is non-volatile, can be electrically erased and written, and that offers short read access times. For these reasons, flash memory has become increasingly popular in portable devices such as personal digital assistants, mobile phones, digital music players, and the like, as well as in computer systems in the form of solid-state drives.

Flash memory is currently available in two types: single-level memory cell (SLC), which can store one data bit per memory cell, and multi-level memory cell (MLC), which can store multiple data bits per memory cell. MLC flash memory is generally implemented in a manner similar to that of NAND logic gates, and so is often referred to as MLC NAND flash memory.

MLC flash memory is organized in memory blocks. Each memory block includes a plurality of pages. Each memory cell spans multiple pages. One problem with this arrangement is that, if power is lost while writing to one page, data is corrupted, not only in that page, but also in the other pages that share the same memory cells.

SUMMARY

In general, in one aspect, an embodiment features an apparatus comprising: a flash controller configured to control a multi-level memory cell (MLC) flash memory, wherein the MLC flash memory includes a plurality of memory blocks, wherein each memory block includes a plurality of memory cells defining a plurality of pages, wherein each memory cell spans a group of the pages in one of the memory blocks, and wherein the flash controller comprises circuitry configured to receive data to be written to the MLC flash memory, select only one page, from each group of the pages, in one or more of the memory blocks, and write the data only to the selected pages.

Embodiments of the apparatus can include one or more of the following features. Some embodiments comprise circuitry configured to write the data from a plurality of the selected pages to a plurality of pages in a further memory block. Some embodiments comprise circuitry configured to erase the data from the plurality of the selected pages subsequent to the data being written from the plurality of the selected pages to the plurality of pages in the further memory block. Some embodiments comprise circuitry configured to write the data from the plurality of the selected pages to the plurality of pages in the further memory block responsive to the plurality of the selected pages being full of the data. Some embodiments comprise circuitry configured to write the data from the plurality of the selected pages to the plurality of pages in the further memory block without the use of a memory external to the flash controller and the MLC flash memory. Some embodiments comprise circuitry configured to select only pages configured to store least-significant bits of data, from each group of the pages, in the one or more of the memory blocks. Some embodiments comprise the MLC flash memory.

In general, in one aspect, an embodiment features a method for controlling a multi-level memory cell (MLC) flash memory, the method comprising: receiving data to be written to the MLC flash memory, wherein the MLC flash memory includes a plurality of memory blocks, wherein each memory block includes a plurality of memory cells defining a plurality of pages, and wherein each memory cell spans a group of the pages in one of the memory blocks; selecting only one page, from each group of the pages, in one or more of the memory blocks; and writing the data to the selected pages only.

Embodiments of the method can include one or more of the following features. Some embodiments comprise writing the data from a plurality of the selected pages to a plurality of pages in a further memory block. Some embodiments comprise erasing the data from the plurality of the selected pages subsequent to the data being written from the plurality of the selected pages to the plurality of pages in the further memory block. Some embodiments comprise writing the data from the plurality of the selected pages to the plurality of pages in the further memory block responsive to the plurality of the selected pages being full of the data. Some embodiments comprise writing the data from the plurality of the selected pages to the plurality of pages in the further memory block without the use of an external memory. Some embodiments comprise selecting only pages configured to store least-significant bits of data, from each group of the pages, in the one or more of the memory blocks.

In general, in one aspect, an embodiment features non-transitory computer-readable media embodying instructions executable by a computer to perform a method for controlling a multi-level memory cell (MLC) flash memory, the method comprising: receiving data to be written to the MLC flash memory, wherein the MLC flash memory includes a plurality of memory blocks, wherein each memory block includes a plurality of memory cells defining a plurality of pages, and wherein each memory cell spans a group of the pages in one of the memory blocks; selecting only one page, from each group of the pages, in one or more of the memory blocks; and writing the data to the selected pages only.

The details of one or more implementations are set forth in the accompanying drawings and the description below. Other features will be apparent from the description and drawings, and from the claims.

DETAILED DESCRIPTION

MLC flash is a flash memory technology that employs multiple levels per memory cell to allow the storage of more data bits per memory cell. Currently, most MLC flash memories store four states per memory cell, yielding two data bits per memory cell. However, embodiments of the present disclosure are independent of the number of states per memory cell. In addition, while most MLC flash memories are currently implemented in a manner similar to that of NAND gates, embodiments of the present disclosure are independent of the manner of implementation of MLC flash memories.

Figure 1:
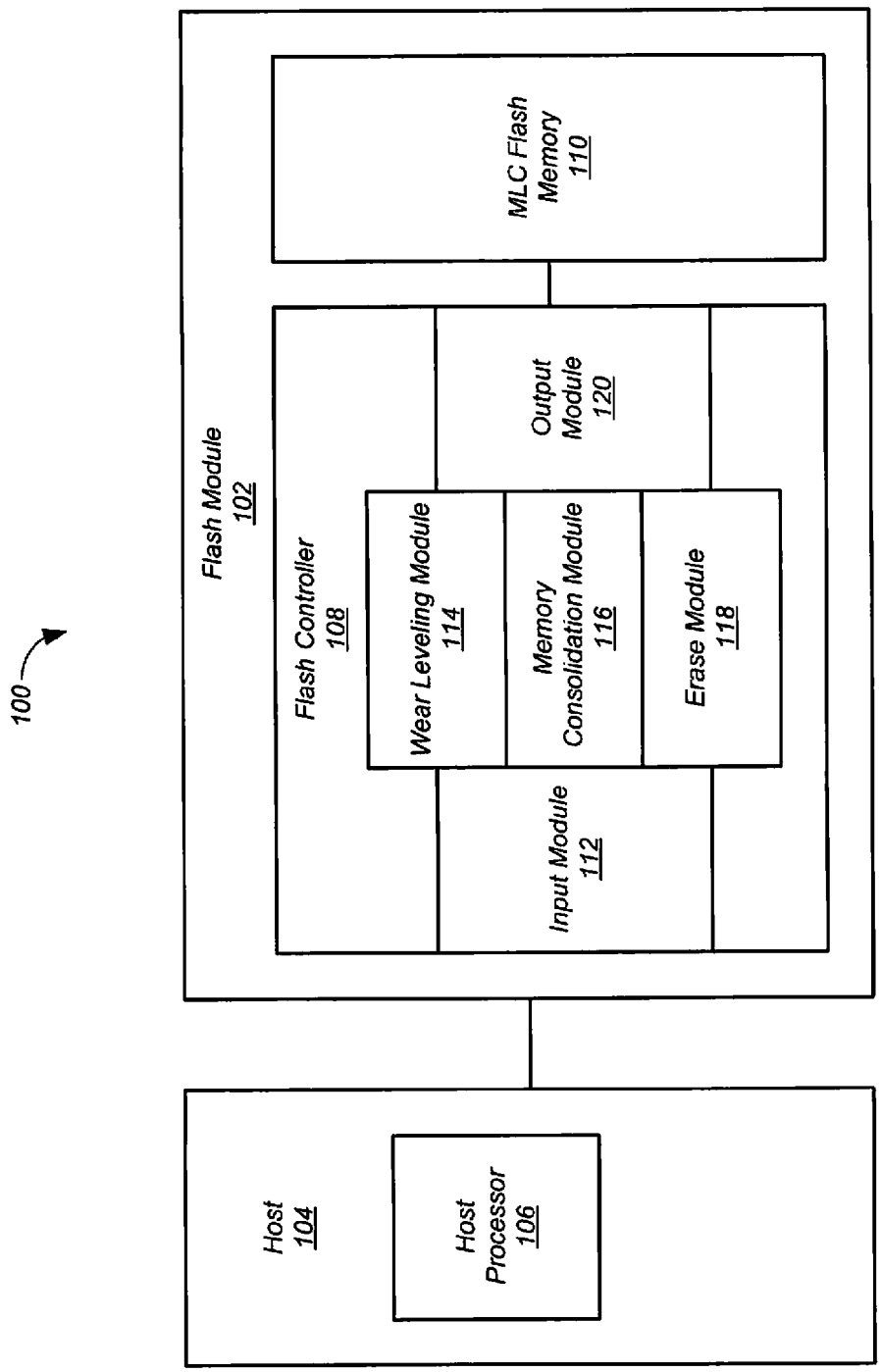
FIG. 1 shows elements of a MLC flash memory system according to one embodiment.

FIG. 1 shows elements of a MLC flash memory system 100 according to one embodiment. Although in the described embodiments the elements of memory system 100 are presented in one arrangement, other embodiments may feature other arrangements. For example, any of the modules shown in FIG. 1 can be combined into fewer modules, divided into further modules, or any combination thereof. Furthermore, elements of memory system 100 can be implemented in circuitry, hardware, software, or combinations thereof.

Referring to FIG. 1, MLC flash memory system 100 includes a flash module 102 in communication with a host 104 that includes a host processor 106. Host 104 can be any sort of data processing device, for example including personal digital assistants, mobile phones, digital music players, and the like, as well as devices such as computer systems and the like. Flash module 102 can be implemented in any sort of data storage device, for example including solid-state drives and the like.

Flash module 102 includes a flash controller 108 in communication with a multi-level memory cell (MLC) flash memory 110. Flash controller 108 includes an input module 112, a wear-leveling module 114, a memory consolidation module 116, an erase module 118, and an output module 120. Flash module 102 can be implemented as one or more integrated circuits. Input module 112 is configured to receive data to be written to MLC flash memory 110 from host 104. Wear-leveling module 114 is configured to select pages in MLC flash memory 110 to be written with the data. Memory consolidation module 116 is configured to perform the memory consolidation operations described below. Erase module 118 is configured to erase pages in MLC flash memory 110. Output module 120 is configured to write the data to the selected pages in MLC flash memory 110.

Figure 2:
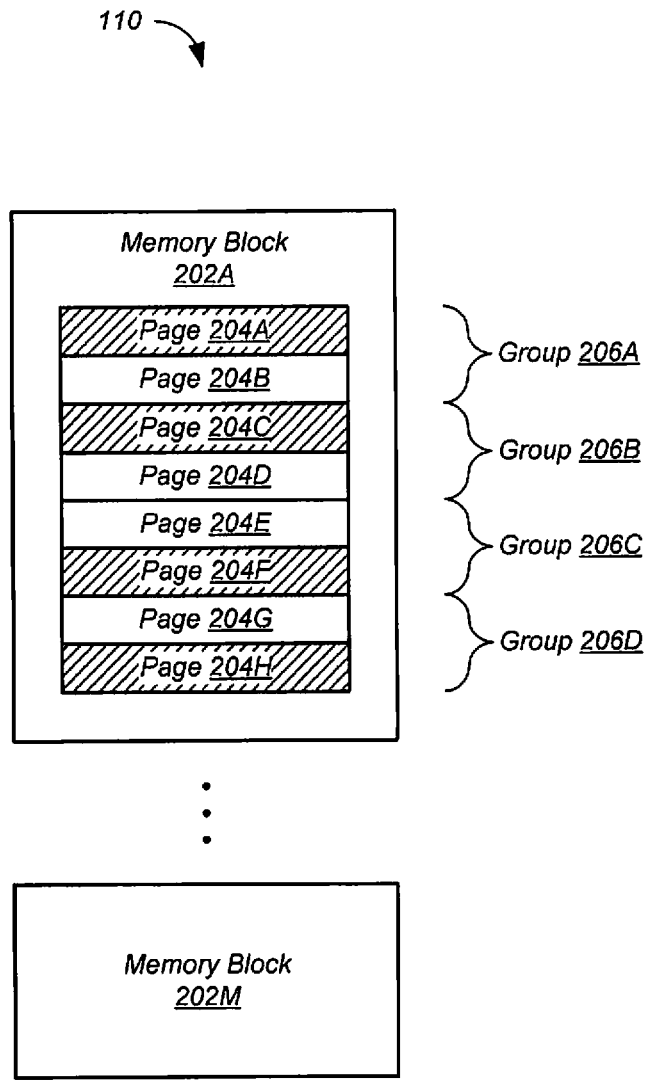
FIG. 2 shows elements of the MLC flash memory of FIG. 1 according to one embodiment.
Figure 2:
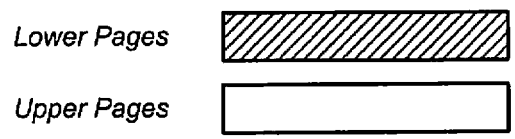

FIG. 2 shows elements of MLC flash memory 110 of FIG. 1 according to one embodiment. Referring to FIG. 2, MLC flash memory 110 is organized as M memory blocks 202A through 202M. Each memory block 202 includes a plurality of pages 204. For example, some current MLC flash memories include 128 or 256 pages each having a storage capacity of 4 kB. One page is the smallest unit of flash memory that can be read or written.

Each memory cell of MLC flash memory 110 has $2^{}N$ states, yielding N data bits per cell. In the example of FIG. 2, N=2, yielding $2^{}2=4$ states and 2 data bits per cell. Each memory cell spans N pages 204. The pages containing the least significant bit of each memory cell are referred to herein as "lower pages." The pages containing the most significant bit of each memory cell are referred to herein as "upper pages." In cases where N>2, the remaining pages are referred to herein as "middle pages." In the drawings, lower pages are shown as cross-hatched. Referring to FIG. 2, pages 204A, 204C, 204F, and 204H are lower pages, while pages 204B, 204D, 204E, and 204G are upper pages.

According to embodiments of the present disclosure, the N pages 204 spanned by a memory cell are referred to as a "group." FIG. 2 shows four groups 206A through 206D. Group 206A includes pages 204A and 204B. Group 206B includes pages 204C and 204D. Group 206C includes pages 204E and 204F. Group 206D includes pages 204G and 204H.

Figure 3:
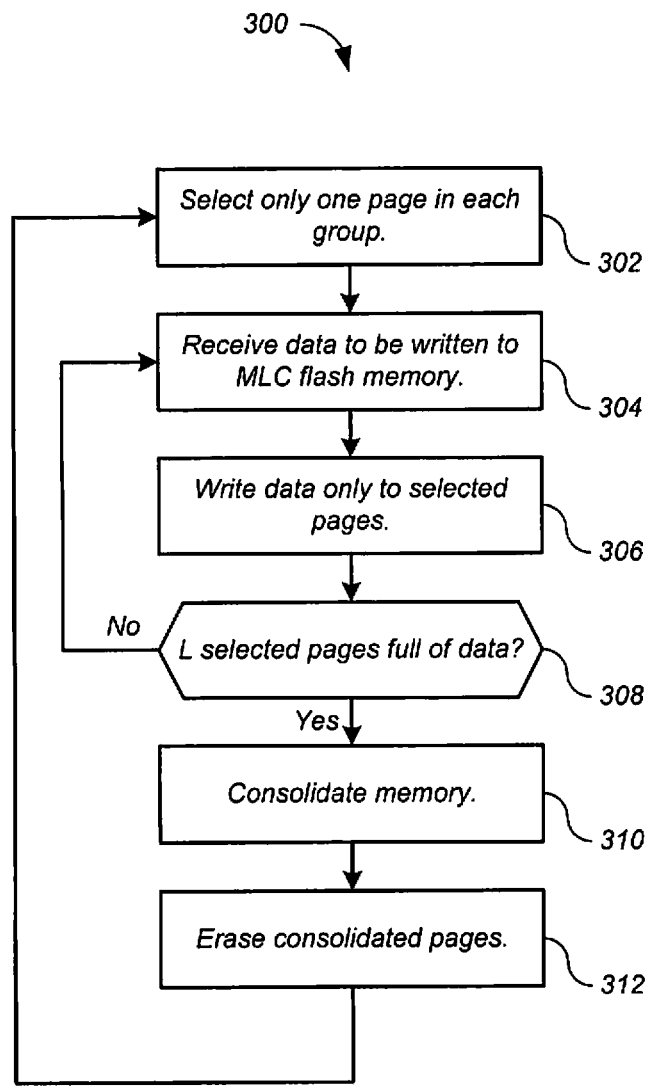
FIG. 3 shows a process for the flash memory system of FIG. 1 according to one embodiment.

FIG. 3 shows a process 300 for flash memory system 100 of FIG. 1 according to one embodiment. Although in the described embodiments the elements of process 300 are presented in one arrangement, other embodiments may feature other arrangements. For example, in various embodiments, some or all of the steps of process 300 can be executed in a different order, concurrently, and the like.

Process 300 is described with reference to the example of FIG. 2, where N=2. However, embodiments of the present disclosure can be used with other values of N. Referring to FIGS. 1, 2 and 3, at 302 wear-leveling module 114 selects only one page 204 from each group 206 in one or more memory blocks 202. Writing least-significant bits in MLC flash memory is faster than writing other bits. Therefore, because lower pages 204 are configured to store least-significant bits of data, wear-leveling module 114 generally selects the lower page 204 in each group 206. For example, wear-leveling module 114 selects pages 204A, 204C, 204F, and 204H in memory block 202. However, other pages 204 can be selected instead. For example, wear-leveling module 114 can select upper pages 204 only. As another example, wear-leveling module 114 can select upper pages 204 in some groups 206, and lower pages in other groups 206. In embodiments where N>2, middle pages 204 can be selected as well or instead. Each flash memory cell has a finite number of program-erase cycles. Therefore wear-leveling module 114 can include wear leveling as a factor in the selection of pages 204.

At 304, input module 112 receives data from host processor 106 to be written to MLC flash memory 110. At 306, output module 120 writes the data only to the selected pages 204. Continuing the above example, output module 120 writes the data to pages 204A, 204C, 204F, and 20414 in memory block 202A. The non-selected pages 204 in each memory block 202 are unused. In this example, pages 204B, 204D, 204E, and 204G in memory block 202A are unused. As noted above, if power is lost while writing to a selected page 204 in a group 206, no data is lost because the remaining pages in the group 206 are unused. In the current example, if power is lost while writing to selected page 204A, no data is lost in page 204B because page 204B is unused.

When a predetermined number L of selected pages 204 are full of data at 308, memory consolidation module 116 performs memory consolidation at 310. L can be selected in any manner. For example, in some embodiments, L is the number of lower (or upper) pages per block, as given by equation (1), where P is the number of pages per block.

$$L = P/N \qquad (1)$$

In other embodiments, L=N. In still other embodiments, L>N. L can be measured over a single memory block 202, over multiple memory blocks 202, or over all of the memory blocks 202 in flash memory 110.

Figure 4:
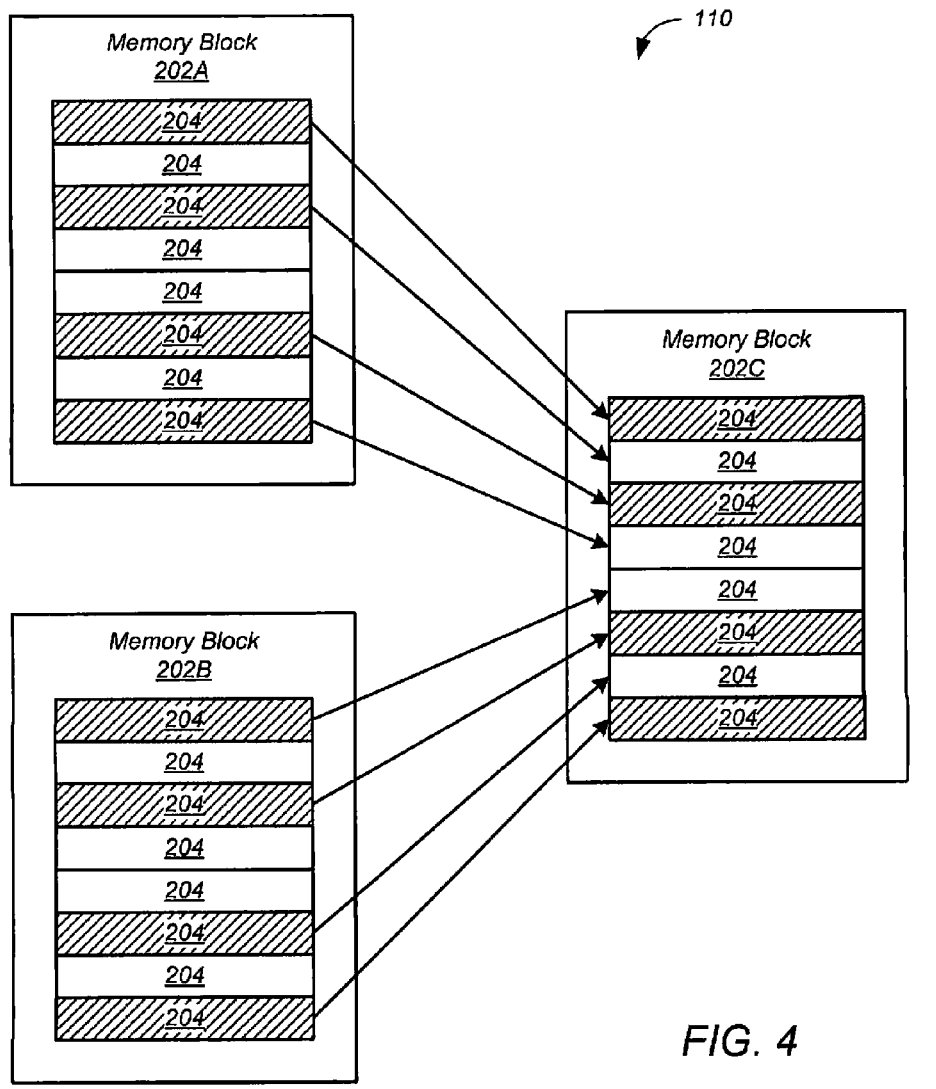
FIG. 4 graphically illustrates a memory consolidation operation for the flash memory of FIG. 2.

According to memory consolidation, memory consolidation module 116 writes the data from L of the selected pages 204 to L pages in a single block 202. FIG. 4 graphically illustrates a memory consolidation operation for flash memory 110 of FIG. 2. Referring to FIG. 4, data from the lower pages 204 of memory blocks 202A and 202B are written to all pages of memory block 202C.

If power is lost during memory consolidation, no data is lost because memory consolidation is a copy operation. In the example of FIG. 4, while the copy of the data being written to memory block 202C may be lost during a power failure, the copy of the data stored in the lower pages 204 of memory blocks 202A and 202B remains, so that no data is lost, and memory consolidation can be repeated when power is restored.

In some embodiments, flash module 102 is capable of moving data between locations in MLC flash memory 110 without the use of a memory external to flash module 102. In these embodiments, memory consolidation module 116 invokes this capability to move data for memory consolidation. For example, flash controller 108 can include an internal page buffer. In this example, flash controller 108 moves the data from one or more source pages 204 in MLC flash memory 110 to the page buffer, and then moves the data from the page buffer to one or more destination pages 204 in MLC flash memory 110.

After memory consolidation, at 312 erase module 118 erases the data from the consolidated pages 204. In the example of FIG. 4, erase module 118 erases the data from the lower pages 204 in memory blocks 202A and 202B. This memory consolidation and erase operation frees the lower pages 204 in memory blocks 202A and 202B for further writing.

After the memory consolidation and erasing, process 300 returns to page selection at 302.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An apparatus comprising:
a flash controller configured to
control a multi-level memory cell (MLC) flash memory, wherein the MLC flash memory includes a plurality of memory blocks, wherein each memory block includes a plurality of memory cells defining a plurality of pages, and wherein each memory cell spans a group of the pages in one of the memory blocks,
receive data to be written to the MLC flash memory,
select only one page, from each group of the pages, in one or more of the memory blocks, and
write the data only to the selected pages; and
circuitry configured to write the data from a plurality of the selected pages to a plurality of pages in a further memory block in response to a predetermined number of the plurality of the selected pages being full of the data,
wherein the predetermined number is based on at least one of a number of pages per memory block and a number of bits per memory cell.

2. The apparatus of claim 1, wherein:
the circuitry is further configured to erase the data from the plurality of the selected pages subsequent to the data being written from the plurality of the selected pages to the plurality of pages in the further memory block.

3. The apparatus of claim 1, wherein:
the circuitry is configured to write the data from the plurality of the selected pages to the plurality of pages in the further memory block without using a memory external to the flash controller and the MLC flash memory.

4. The apparatus of claim 1, wherein:
the flash controller is further configured to select only pages configured to store least-significant bits of data, from each group of the pages, in the one or more of the memory blocks.

5. The apparatus of claim 1, further comprising:
the MLC flash memory.

6. The apparatus of claim 5, further comprising:
a host processor to provide the data to be written to the MLC flash memory.

7. The apparatus of claim 1, wherein the predetermined number is equal to the number of pages per memory block to the number of bits per memory cell.

8. The apparatus of claim 1, wherein the predetermined number is equal to the number of bits per memory cell.

9. The apparatus of claim 1, wherein the predetermined number is greater or less than the number of bits per memory cell.

10. The apparatus of claim 1, wherein the predetermined number is measured over one or more of the memory blocks.

11. A method for controlling a multi-level memory cell (MLC) flash memory, the method comprising:
receiving data to be written to the MLC flash memory, wherein the MLC flash memory includes a plurality of memory blocks, wherein each memory block includes a plurality of memory cells defining a plurality of pages, and wherein each memory cell spans a group of the pages in one of the memory blocks;
selecting only one page, from each group of the pages, in one or more of the memory blocks;
writing the data to the selected pages only; and
writing the data from a plurality of the selected pages to a plurality of pages in a further memory block in response to a predetermined number of the plurality of the selected pages being full of the data, wherein the predetermined number is based on at least one of a number of pages per memory block and a number of bits per memory cell.

12. The method of claim 11, further comprising:
erasing the data from the plurality of the selected pages subsequent to the data being written from the plurality of the selected pages to the plurality of pages in the further memory block.

13. The method of claim 11, further comprising:
writing the data from the plurality of the selected pages to the plurality of pages in the further memory block without using a memory external to a flash module.

14. The method of claim 11, further comprising:
selecting only pages configured to store least-significant bits of data, from each group of the pages, in the one or more of the memory blocks.

15. Non-transitory computer-readable media embodying instructions executable by a computer to perform a method for controlling a multi-level memory cell (MLC) flash memory, the method comprising:
receiving data to be written to the MLC flash memory, wherein the MLC flash memory includes a plurality of memory blocks, wherein each memory block includes a plurality of memory cells defining a plurality of pages, and wherein each memory cell spans a group of the pages in one of the memory blocks;
selecting only one page, from each group of the pages, in one or more of the memory blocks;
writing the data to the selected pages only; and
writing the data from a plurality of the selected pages to a plurality of pages in a further memory block in response to a predetermined number of the plurality of the selected pages being full of the data,
wherein the predetermined number is based on at least one of a number of pages per memory block and a number of bits per memory cell.

16. The computer-readable media of claim 15, wherein the method further comprises:
erasing the data from the plurality of the selected pages subsequent to the data being written from the plurality of the selected pages to the plurality of pages in the further memory block.

17. The computer-readable media of claim 15, wherein the method further comprises:
writing the data from the plurality of the selected pages to the plurality of pages in the further memory block without using a memory external to a flash module.

18. The computer-readable media of claim 15, wherein the method further comprises:
selecting only pages configured to store least-significant bits of data, from each group of the pages, in the one or more of the memory blocks.

* * * * *